United States Patent
Ducruet et al.

(10) Patent No.: US 12,287,381 B2
(45) Date of Patent: Apr. 29, 2025

(54) MAGNETORESISTIVE SENSOR ELEMENT FOR SENSING A TWO-DIMENSIONAL MAGNETIC FIELD WITH LOW HIGH-FIELD ERROR

(71) Applicant: Allegro MicroSystems, LLC, Manchester, NH (US)

(72) Inventors: Clarisse Ducruet, Chambéry (FR); Léa Cuchet, Moirans (FR); Jeffrey Childress, San Jose, CA (US)

(73) Assignee: Allegro MicroSystems, LLC, Manchester, NH (US)

( * ) Notice: Subject to any disclaimer, the term of this patent is extended or adjusted under 35 U.S.C. 154(b) by 466 days.

(21) Appl. No.: 17/905,352

(22) PCT Filed: Mar. 2, 2021

(86) PCT No.: PCT/IB2021/051724
§ 371 (c)(1),
(2) Date: Aug. 31, 2022

(87) PCT Pub. No.: WO2021/181203
PCT Pub. Date: Sep. 16, 2021

(65) Prior Publication Data
US 2023/0127582 A1   Apr. 27, 2023

(30) Foreign Application Priority Data
Mar. 11, 2020 (EP) ...................................... 20315038

(51) Int. Cl.
*H10N 50/10* (2023.01)
*G01R 33/09* (2006.01)
(Continued)

(52) U.S. Cl.
CPC ......... *G01R 33/098* (2013.01); *G01R 33/093* (2013.01); *H01F 10/3272* (2013.01); *H10N 50/10* (2023.02); *H10N 50/85* (2023.02)

(58) Field of Classification Search
CPC ...... H10N 50/10; H10N 50/85; G01R 33/093; H01F 10/3254
See application file for complete search history.

(56) References Cited

U.S. PATENT DOCUMENTS 7,800,868 B2   9/2010  Gao et al.
8,081,404 B2   12/2011  Ibusuki et al.
(Continued)

FOREIGN PATENT DOCUMENTS

JP   2013-235914 A   11/2013

OTHER PUBLICATIONS

European Intention to Grant dated Jun. 26, 2024 for European Application No. 20315038.8; 28 Pages.
(Continued)

*Primary Examiner* — Wasiul Haider
(74) *Attorney, Agent, or Firm* — DALY, CROWLEY, MOFFORD & DURKEE, LLP

(57) ABSTRACT

A magnetoresistive element for a two-dimensional magnetic field sensor, including: a ferromagnetic reference layer having a fixed reference magnetization, a ferromagnetic sense layer having a sense magnetization that can be freely oriented relative to the reference magnetization in the presence of an external magnetic field, and a tunnel barrier layer between the reference and sense ferromagnetic layers; the reference layer including a reference coupling layer between a reference pinned layer and a reference coupled layer; the reference coupled layer including a first coupled sublayer in contact with the reference coupling layer, a second coupled sublayer, a third coupled sublayer and a insert layer between
(Continued)

the second and third coupled sublayers; the insert layer comprising a transition metal and has a thickness between about 0.1 and about 0.5 nm, and the thickness of the reference coupled layer is between about 1 nm and about 5 nm.

3 Claims, 3 Drawing Sheets

(51) Int. Cl.
  *H01F 10/32* (2006.01)
  *H10N 50/85* (2023.01)

(56) References Cited

U.S. PATENT DOCUMENTS

| | | | |
|---|---|---|---|
| 8,582,253 | B1 | 11/2013 | Zheng et al. |
| 9,991,314 | B2 | 6/2018 | Hase et al. |
| 2012/0257298 | A1 | 10/2012 | Sato et al. |
| 2015/0162525 | A1 | 6/2015 | Park et al. |
| 2015/0228891 | A1 | 8/2015 | Park et al. |
| 2018/0076384 | A1 | 3/2018 | Gan et al. |
| 2019/0051822 | A1 | 2/2019 | Chatterjee et al. |
| 2019/0198566 | A1* | 6/2019 | Wang ............... H10N 50/85 |
| 2020/0066790 | A1 | 2/2020 | Lassalle-Balier et al. |
| 2021/0065949 | A1* | 3/2021 | Campiglio ......... H10N 50/10 |

OTHER PUBLICATIONS

Response (with Machine English Translation from Espacenet.com) to Japanese Office Action dated Nov. 12, 2024 for Japanese Application No. 2022-548871; Response Filed Dec. 13, 2024; 12 Pages.
International Search Report for issued in Application No. PCT/IB2021/051724 dated May 11, 2021.
Written Opinion for PCT/IB2021/051724 dated May 11, 2021.
Japanese Office Action (with English Translation) issued on Nov. 12, 2024 for Japanese Application No. 2022-548871; 5 Pages.
Japanese Decision to Grant (with Machine English Translation from Espacenet.com) dated Feb. 18, 2025 for Japanese Application No. 2022-548871; 6 Pages.

* cited by examiner

MAGNETORESISTIVE SENSOR ELEMENT FOR SENSING A TWO-DIMENSIONAL MAGNETIC FIELD WITH LOW HIGH-FIELD ERROR

FIELD

The present invention relates to a magnetoresistive sensor element for sensing a two-dimensional (2D) magnetic field with low high-field error. The present invention also relates to a magnetic field sensor comprising the magnetoresistive element.

BACKGROUND

A magnetic sensor element based on the tunnel magnetoresistance (TMR) effect can be used for 2D magnetic field detection. Such magnetic sensor element typically comprises a ferromagnetic reference layer having a fixed reference magnetization, a tunnel barrier layer and a ferromagnetic sense layer having a sense magnetization freely orientable relative to the reference magnetization in the presence of the magnetic field. The reference layer can comprise a synthetic antiferromagnetic (SAF) structure including a pinned first ferromagnetic reference layer in contact with an antiferromagnetic layer, a coupling spacer layer and a second ferromagnetic reference layer. In order to have a good accuracy, the magnetic sensor element should have low angular error at high magnetic fields.

Low angular error at high magnetic fields can be achieved by increasing the stiffness of the SAF structure. Increasing the stiffness of the SAF structure is usually achieved by decreasing the thicknesses of the first ferromagnetic reference layer and of the second ferromagnetic reference layer. For instance, the thicknesses of the first and second ferromagnetic layers can be decreased down to 1.0 nm. This results in increasing the saturation field $H_{sat}$ of the magnetic sensor element. The magnetization of the SAF structure becomes more stable (rigid) at high applied magnetic fields. However, decreasing the thickness of the first and second first ferromagnetic reference layers is detrimental to magneto-transport properties of the magnetic sensor element. Such small thickness further results in losing the pinning with the AF layer and the TMR response of the magnetic sensor element becomes very low.

Document US2011134563 relates to a magnetoresistive head including a magnetically pinned layer, a free magnetic layer positioned above the magnetically pinned layer, and a tunnel barrier layer, wherein at least one of the magnetically pinned layer and the free magnetic layer has a layered structure, the layered structure including a crystal layer comprising one of: a CoFe magnetic layer or a CoFeB magnetic layer and an amorphous magnetic layer comprising CoFeB and an element selected from: Ta, Hf, Zr, and Nb, wherein the crystal layer is positioned closer to a tunnel barrier layer than the amorphous magnetic layer.

Document US2012257298 describes a TMR head including an AFM layer, a first ferromagnetic layer above the AFM layer, a second ferromagnetic layer above the first ferromagnetic layer, an AF coupling layer between the first and second ferromagnetic layers, a fixed layer above the second ferromagnetic layer, an insertion layer adjacent the fixed layer or in the fixed layer, a barrier layer above the fixed layer, and a free layer above the barrier layer.

Document US202006679 describes a material stack including a first magnetoresistance element with a first direction of response to an external magnetic field and a second magnetoresistance element with second direction of response to the external magnetic field, opposite to the first direction of response. The first magnetoresistance element can be disposed under or over the second magnetoresistance element. An insulating layer separates the first and second magnetoresistance elements.

Document U.S. Pat. No. 8,582,253 discloses a magnetic sensor having a high spin polarization reference layer stack above AFM layers. The reference layer stack comprises a first boron-free ferromagnetic layer above the AFM coupling layer; a magnetic coupling layer on and in contact with the first boron-free ferromagnetic layer; a second ferromagnetic layer comprising boron deposited on and contact with the magnetic coupling layer; and a boron-free third ferromagnetic layer on and in contact the second ferromagnetic layer.

Document US2015162525 discloses a magnetic memory device including a magnetic tunnel junction memory element that may include a reference magnetic layer, a tunnel barrier layer, and a free magnetic layer. The reference magnetic layer may include a first pinned layer, an exchange coupling layer, and a second pinned layer. The exchange coupling layer may be between the first and second pinned layers, and the second pinned layer may include a ferromagnetic layer and a non-magnetic layer. The second pinned layer may be between the first pinned layer and the tunnel barrier layer, and the tunnel barrier layer may be between the reference magnetic layer and the free magnetic layer.

SUMMARY

The present disclosure concerns a magnetoresistive element for a two-dimensional magnetic field sensor, comprising a ferromagnetic reference layer having a fixed reference magnetization, a ferromagnetic sense layer having a sense magnetization that can be freely oriented relative to the reference magnetization in the presence of an external magnetic field, and a tunnel barrier layer between the reference and sense ferromagnetic layers; the reference layer comprising a reference coupling layer between a reference pinned layer and a reference coupled layer; the reference coupled layer comprises a first coupled sublayer in contact with the reference coupling layer, a second coupled sublayer, a third coupled sublayer and a insert layer between the second and third coupled sublayers; the insert layer comprising a transition metal and has a thickness between about 0.1 and about 0.5 nm, and the thickness of the reference coupled layer is between about 1 nm and about 5 nm.

In an embodiment, the reference pinned layer comprises a CoFe alloy and has a thickness of 2 nm, the tunnel barrier layer comprises Mg, insert layer comprises Ta, the first coupled sublayer is made of a CoFe alloy, 0.5 nm in thickness, the second coupled sublayer is made of a CoFeB alloy and has a thickness of 0.75 nm, and the third coupled sublayer is made of a CoFeB alloy and has a thickness between 0.45 nm and 0.95 nm. The magnetoresistive element is thermally treated at 310° C. during 90 min under an applied magnetic field of about 1 T.

The present disclosure further concerns a magnetic field sensor for sensing a two-dimensional magnetic field, comprising the magnetoresistive element.

The magnetoresistive element disclosed herein has high saturation field $H_{sat}$ and TMR response. The magnetoresistive element further has high stiffness of the SAF reference layer and improved thermal stability. The magnetoresistive element provides reduced angular error, even at high magnetic fields, and thus improved accuracy. The high saturation field $H_{sat}$, exchange stiffness (SAF coupling) and TMR response of the magnetoresistive element can be obtained without decreasing the magnetic layer thicknesses of the SAF structure.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
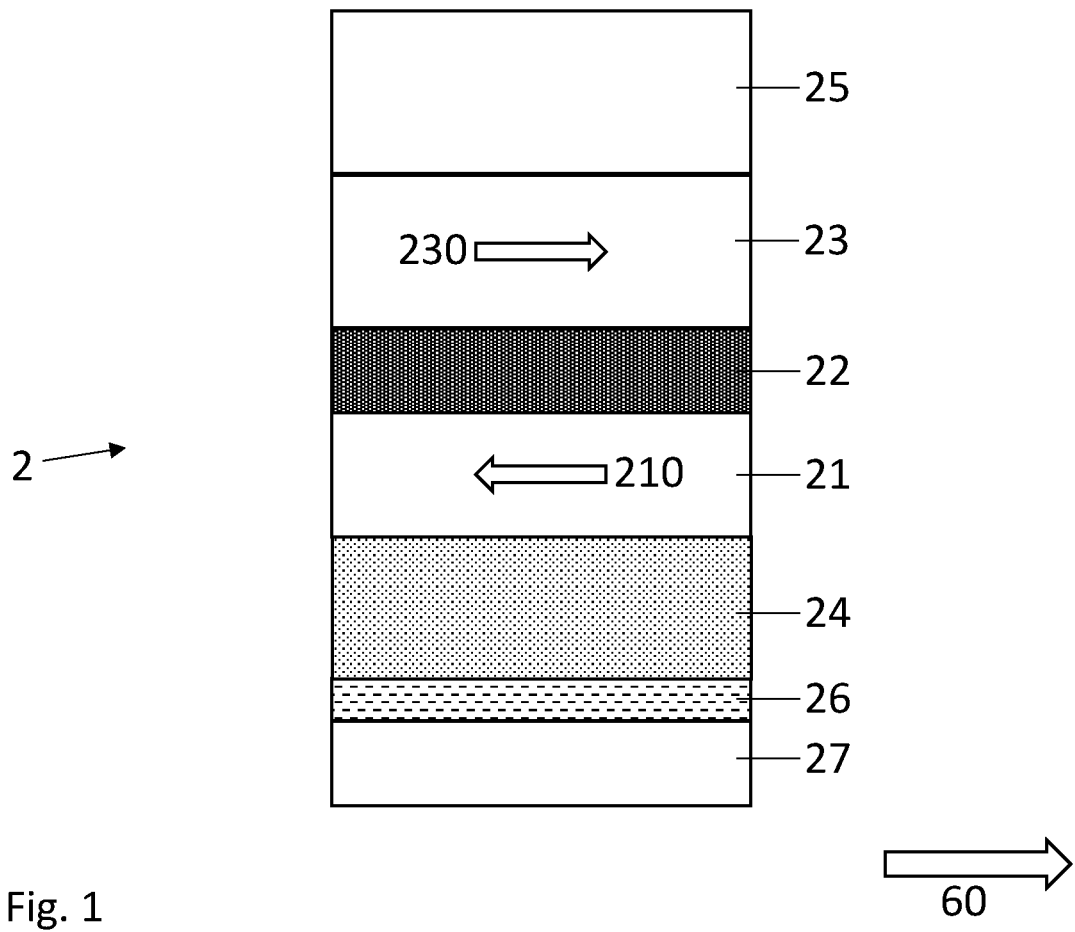
FIG. 1 shows a schematic view of a magnetoresistive element comprising a ferromagnetic reference layer, a ferromagnetic sense layer and a tunnel barrier layer, according to an embodiment.

FIG. 1 shows a schematic view of a magnetoresistive element 2 according to an embodiment. The magnetoresistive element 2 comprises a ferromagnetic reference layer 21, a ferromagnetic sense layer 23 and a tunnel barrier layer 22 between the reference and sense ferromagnetic layers 21, 23. The reference layer 21 has a fixed reference magnetization 210 while the sense layer 23 has a sense magnetization 230 that can be freely oriented relative to the reference magnetization 210 in the presence of an external magnetic field 60. In other words, when the magnetoresistive element 2 is in the presence of the external magnetic field 60, the reference magnetization 210 remains substantially fixed while the sense magnetization 230 is deflected in the direction of the external magnetic field 60. The magnetoresistive element 2 can further comprise a capping layer 25 on the side of the sense layer 23 and a seed layer 27 on the side of the reference layer 21.

The capping layer 25 can comprise a layer of TaN, Ru or Ta. The capping layer 25 can comprises multilayers including any layer of tantalum nitride (TaN), ruthenium (Ru) or tantalum (Ta) or a combination of these layers. In a particular configuration, the capping layer 25 comprises a multilayer including a 80 nm layer of TaN, a 5 nm layer of Ru, a 2 nm layer of TaN, a 5 nm layer of Ru, a 2 nm layer of Ta and a 1 nm layer of Ru. The seed layer 27 can comprise any one of Ta, tungsten (W), molybdenum (Mo), titanium (Ti), hafnium (Hf) or magnesium (Mg).

The tunnel barrier layer 22 can comprise, or be formed of, an insulating material. Suitable insulating materials include oxides, such as aluminum oxide (e.g., $Al_2O_3$) and magnesium oxide (e.g., MgO). A thickness of the tunnel barrier layer 22 can be in the nm range, such as from about 1 nm to about 3 nm. An optimal thickness of the tunnel barrier 22 can be obtained by inserting a plurality (double or multilayer) of MgO (or another suitable oxide or insulating material) layers. The tunnel barrier layer 22 can be configured to provide high TMR, for example above 80%.

The reference layer 21 and the sense layer 23 can include, or be formed of, a magnetic material and, in particular, a magnetic material of the ferromagnetic type. A ferromagnetic material can be characterized by a magnetization with a particular coercivity, which is indicative of a magnitude of the external magnetic field 60 that is required to reverse the magnetization 230 after it is driven to saturation in one direction. Suitable ferromagnetic materials include transition metals, rare earth elements, and their alloys, either with or without main group elements. For example, suitable ferromagnetic materials include iron (Fe), cobalt (Co), nickel (Ni), and their alloys, such as NiFe or CoFe alloys; alloys based on Ni, Fe, and boron (B) and alloys based on Co, Fe, and B. In some instances, alloys based on Ni and Fe (and optionally B) can have a smaller coercivity than alloys based on Co and Fe (and optionally B).

In particular, the reference magnetization 210 and the sense magnetization 230 can be orientable substantially within the plane of the reference layer 21 and sense layer 23 (in-plane, as illustrated in FIG. 1) or can be orientable in a plane substantially perpendicular to the plane of the reference layer 21 and sense layer 23 (out-of-plane, not shown).

Figure 2:
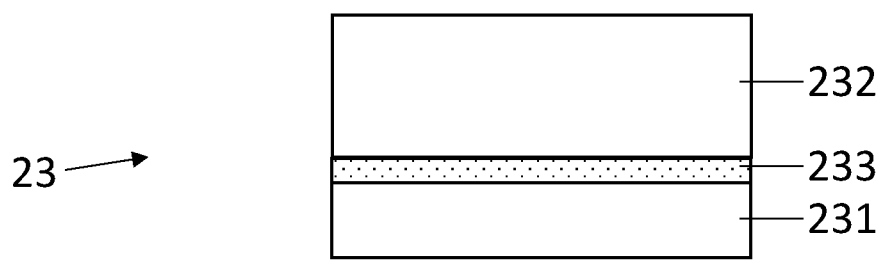
FIG. 2 shows a schematic view of the sense layer according to a particular configuration.

FIG. 2 shows a schematic view of the sense layer 23 according to a particular configuration. The sense layer 23 comprises a first ferromagnetic sense sublayer 231 in contact with the tunnel barrier layer 22, a second ferromagnetic sense sublayer 232, and a non-magnetic sense sublayer 233 between the first and second ferromagnetic sense sublayers 231, 232. The first ferromagnetic sense sublayer 231 can comprise a CoFeB alloy, for example a $(Co_xFe\ 1-x)80B20$ alloy, where x=0.1 to 0.9, the non-magnetic sense sublayer 233 can comprise a layer comprising Ta, W, Mo, Ti, Hf, Mg or Al or a combination of any of these elements, and the second ferromagnetic sense sublayer 232 can comprise a soft magnetic material having a low planar anisotropy value. For example, the second ferromagnetic sense sublayer 232 can comprise a NiFe alloy or a NiFe alloy comprising B or Cr. In one particular but not limiting aspect, the structure of the sense layer 21 is as follows: $CoFeB_{1.5}/Ta_{0.3}/NiFe_4$, where the first ferromagnetic sense sublayer 231 comprises a CoFeB alloy 1.5 nm in thickness, the non-magnetic sense sublayer 233 comprises a Ta layer 0.3 nm in thickness, the second ferromagnetic sense sublayer 232 comprises a NiFe alloy 4 nm in thickness. Such sense layer 23 can have very low anisotropy field $H_k$.

The magnetoresistive element 2 can comprise an antiferromagnetic layer 24 exchange coupling the reference layer 21 such as to pin the reference magnetization 210 at a low temperature threshold and free it at a high temperature threshold. Suitable antiferromagnetic materials can include alloys based on manganese (Mn), such as alloys based on iridium (Ir) and Mn (e.g., IrMn); alloys based on Fe and Mn (e.g., FeMn); alloys based on platinum (Pt) and Mn (e.g., PtMn or CrPdM); alloys based on Ni and Mn (e.g., NiMn) or oxides such as NiO. Suitable materials for the antiferromagnetic layer 24 can further include oxide layers, such as NiO. In a possible configuration, the antiferromagnetic layer 24 have a thickness of about 4 nm to about 30 nm. Alternatively, the antiferromagnetic layer 24 can comprise a multilayer wherein each layer has a thickness between 1 and 10 nm or between 1 and 2 nm. In another arrangement, the antiferromagnetic layer 24 can comprise a tri-layer arrangement including, for example, a central antiferromagnetic layer sandwiched between two antiferromagnetic layer having lower blocking temperature Tb than the central antiferromagnetic layer. Such tri-layer arrangement ease switching the reference magnetization 210 when programming the reference layer 21. The antiferromagnetic layer 24 can be separated from the seed layer 27 by an underlayer 26, where the underlayer 26 can comprise Ru, Cu or their nitrides. The underlayer 26 can have a thickness between about 1 nm and about 5 nm.

Figure 3:
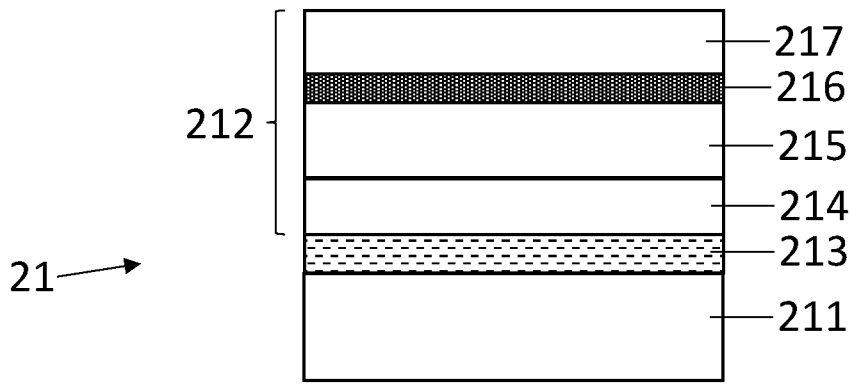
FIG. 3 shows the reference layer comprising SAF structure including a reference coupling layer between a reference pinned layer and a reference coupled layer, according to an embodiment.

In an embodiment shown in FIG. 3, the reference layer 21 comprises a synthetic antiferromagnetic (SAF) structure comprising a reference coupling layer 213 between a reference pinned layer 211 and a reference coupled layer 212. The reference pinned layer 211 is pinned by the antiferromagnetic layer 24. The reference coupled layer 212 can be coupled to the reference pinned layer 211 by an RKKY coupling mechanism through the reference coupling layer 213. The reference coupling layer 213 can comprise a non-magnetic layer of Ru, Ir or copper (Cu) or a combination thereof.

In one aspect, the reference coupled layer 212 comprises a first coupled sublayer 214 in contact with the reference coupling layer 213, a second coupled sublayer 215 and a third coupled sublayer 217. The reference coupled layer 212 can further comprise an insert layer 216 between the second and third coupled sublayers 215, 217.

The insert layer 216 comprises a transition metal. The insert layer 216 comprises Ta, Ti, W, Mo, Hf, Mg or aluminium (Al) or a combination of any of these elements. Alternatively, the insert layer 216 can comprise Ni, chromium (Cr), vanadium (V) or silicon (Si) or a combination of any of these elements. The insert layer 216 may be amorphous or quasi-amorphous or nanocrystalline.

The insert layer 216 can have a thickness between about 0.1 and about 0.5 nm. Such thickness of the insert layer 216 allows for ferromagnetic exchange coupling and thus, maintaining the alignment of the magnetization of the second coupled sublayer 215 and the third coupled sublayer 217 parallel to each other. The insert layer 216 further allows for increasing the TMR of the magnetoresistive element 2. For example, a TMR increase from about 90%, without the insert layer 216, to about 120% can be achieved. A high TMR is results in a better SNR ratio of the magnetoresistive element 2 response and decreases dispersion of the magnetoresistive element 2 response.

The thin insert layer 216 allows to preserve or even improve the smoothness of the reference coupled layer 212 at interface of the reference coupling layer 213. The thin insert layer 216 increases the RKKY coupling between the reference pinned layer 211 and the reference coupled layer 212 (through the reference coupling layer 213) and thus, increases the stiffness of the reference pinned layer 211 and the reference coupled layer 212. A high RKKY coupling results in the reference magnetization 210 being less likely to be tilted by the external magnetic field 60. Therefore, a high RKKY coupling between the reference pinned layer 211 and the reference coupled layer 212 allows for decreasing angular errors, including at high magnitude of the external magnetic field 60 and thus broadening the high-field operation margin of the magnetoresistive element 2. A high RKKY coupling further improves thermal stability of the magnetoresistive element 2. In one aspect, the RKKY coupling constant energy ($J_{RKKY}$ parameter) of the ferromagnetic reference layer 21 is about 1 erg/cm$^2$.

The thin insert layer 216 further acts as a texture transition layer between the magnetic properties of the reference layer 21 (such as magnetic saturation field $H_{sat}$ and SAF coupling exchange field $H_{ex}$) and the electric properties of the tunnel barrier layer 22 (such as TMR).

The magnetoresistive element 2 comprising the transition metal containing thin insert layer 216 having a thickness between 0.1 and about 0.5 nm increases the magnetic saturation field $H_{sat}$ by about 5% compared to the magnetic saturation field $H_{sat}$ of the magnetoresistive element 2 without the thin insert layer 216. The insert further allows to increase the TMR of the magnetoresistive element 2 by about 30%. The high TMR allows for reducing magnetic noise level in the magnetoresistive element 2 response and decreasing dispersion in the magnetoresistive element 2 response between different magnetoresistive elements 2.

The SAF structure of the reference layer 21 can be compensated such that the macroscopic magnetization is null without applied field by adjusting the thickness of the reference pinned layer 211 and the reference coupled layer 212.

In one aspect, the first coupled sublayer 214 comprises a Co or CoFe alloy. The second coupled sublayer 215 and the third coupled sublayer 217 can comprise Co, Fe, Ni, Cr, V, Si or B, or a combination of any of these elements.

The reference pinned layer 211 can comprise a CoFe alloy or Co or CoFe/CoFeB/CoFe or Co/CoFeB/Co multilayers or any other layers comprising Co, CoFe and CoFeB.

The thickness of the second coupled sublayer 215 can be below about 1 nm and the thickness of the third coupled sublayer 217 can be below about 1 nm or about 2 nm. The thickness of the first coupled sublayer 214 can be below about 1 nm.

In one aspect, the second coupled sublayer 215 has a thickness between 1 and 2 times the thickness of the third coupled sublayer 217.

In an embodiment, the total thickness of the reference coupled layer 212 is between about 1 nm and about 5 nm. The total thickness of the reference coupled layer 212 can be between about 1 nm and about 3 nm and preferably between about 2 nm and about 3 nm.

The reference layer 21 disclosed herein has an enhanced SAF stiffness. The magnetoresistive element 2 has low angular errors, even at high magnetic fields, and improved thermal stability, while not affecting the other magnetic properties of the magnetoresistive element 2, such as the SAF saturation field $H_{sat}$ and even increasing TMR.

Figure 4:
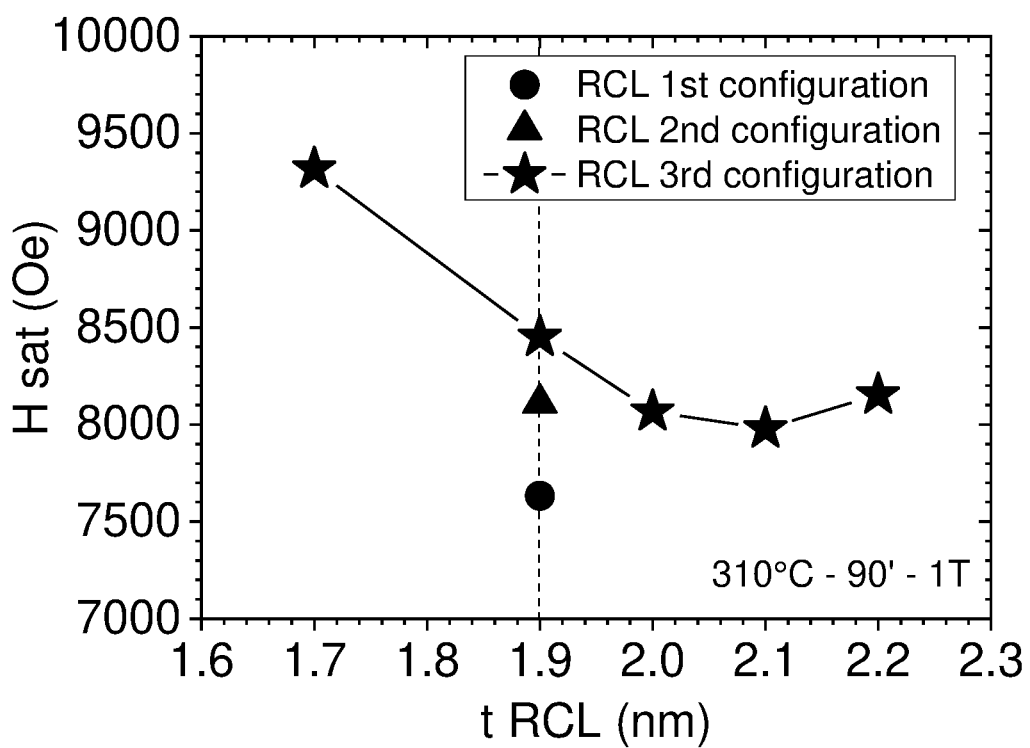
FIG. 4 is a graph reporting the relationship between the magnetic saturation field and the thickness of the reference coupled layer.

FIG. 4 is a graph reporting the relationship between the magnetic saturation field $H_{sat}$ of the magnetoresistive element 2 and the thickness of the reference coupled layer 212. The saturation field $H_{sat}$ was measured on the magnetoresistive element 2 comprising a reference pinned layer 211 comprising a CoFe alloy and having a thickness of about 2 nm and a tunnel barrier layer 22 comprising a deposited metallic Mg that is oxidized, for example by using a natural or plasma oxidation processes. The deposition and oxidation can be repeated two to four successive times. The magnetoresistive element 2 was thermally treated at 310° C. during 90 min under a applied magnetic field of about 1 T.

In a first configuration, the reference coupled layer 212 comprises a single layer made of a CoFeB alloy and about 1.9 nm in thickness (dot). In a second configuration, the reference coupled layer 212 is about 1.9 nm in thickness and comprises the first coupled sublayer 214 made of a CoFe alloy, about 0.5 nm in thickness, and the second coupled sublayer 215 made of a CoFeB alloy, about 1.4 nm in thickness of (triangle). In a third configuration, the reference coupled layer 212 comprises the first coupled sublayer 214 made of a CoFe alloy, about 0.5 nm in thickness, the second coupled sublayer 215 made of a CoFeB alloy, about 0.75 nm in thickness, the insert layer 216 made of Ta, about 0.2 nm in thickness, and the third coupled sublayer 217 made of a CoFeB alloy and having various thicknesses between about 0.45 nm and about 0.95 nm (stars).

Compared to the first and second configurations, in the third configuration, the magnetoresistive element 2 has a saturation field $H_{sat}$ that is higher by about 300 Oe (5%).

Figure 5:
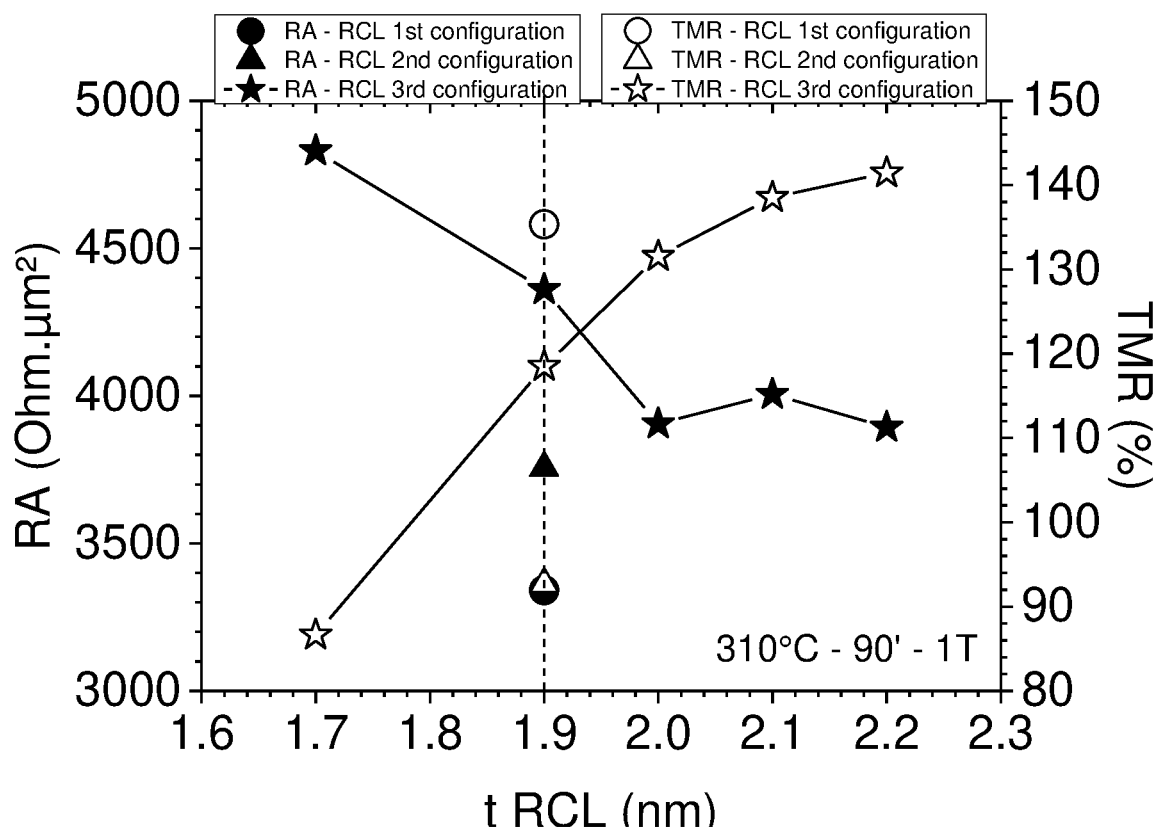
FIG. 5 is a graph reporting the relationship between the resistance-area product of the magnetoresistive element and the thickness of the reference coupled layer.

FIG. 5 is a graph reporting the relationship between the resistance-area product RA of the magnetoresistive element 2 and the thickness of the reference coupled layer 212. The RA was measured for the magnetoresistive element 2 in the first, second and third configurations described above (respectively closed dot, triangle and star). FIG. 5 further reports the relationship between the TMR response of the magnetoresistive element 2 and the thickness of the reference coupled layer 212 for the first, second and third configurations of the magnetoresistive element 2 (respectively open dot, triangle and star).

As shown in FIG. 5, the third configuration of the magnetoresistive element 2 yields higher TMR values compared to the TMR observed for the other configurations. For the third configuration with the third coupled sublayer 217 having a thickness of about 0.65 nm, the TMR is higher by about 30%. A third coupled sublayer 217 having a thickness between about 0.45 nm and about 0.95 nm yields a TMR increase from about 90%, without the insert layer 216, to about 140%.

REFERENCE NUMBERS AND SYMBOLS 2 magnetoresistive element
21 ferromagnetic reference layer
210 reference magnetization
211 reference pinned layer
212 reference coupled layer
213 reference coupling layer
214 first coupled sublayer
215 second coupled sublayer
216 insert layer
217 third coupled sublayer
22 tunnel barrier layer
23 ferromagnetic sense layer
230 sense magnetization
231 first ferromagnetic sense sublayer
232 second ferromagnetic sense sublayer
233 non-magnetic sense sublayer
24 antiferromagnetic layer
25 capping layer
26 underlayer
27 seed layer
60 external magnetic field
$H_{ex}$ SAF coupling exchange field
$H_k$ anisotropy field
$H_{sat}$ magnetic saturation field
$J_{ex}$ coupling energy density
RA resistance-area product

The invention claimed is:

1. A magnetoresistive element for a two-dimensional magnetic field sensor, comprising:
a ferromagnetic reference layer having a fixed reference magnetization, a ferromagnetic sense layer having a sense magnetization that can be freely oriented relative to the reference magnetization in the presence of an external magnetic field, and a tunnel barrier layer between the reference and sense ferromagnetic layers;
the reference layer comprising a reference coupling layer between a reference pinned layer and a reference coupled layer;
the reference coupled layer comprises a first coupled sublayer in contact with the reference coupling layer, a second coupled sublayer in contact with the first coupled sublayer, a third coupled sublayer and an insert layer between the second and third coupled sublayers, the insert layer providing a ferromagnetic exchange coupling between the second and third coupled sublayers; and
the insert layer has a thickness of 0.2 nm;
wherein the reference pinned layer comprises a CoFe alloy and has a thickness of 2 nm, the tunnel barrier layer comprises Mg;
wherein the insert layer comprises Ta, the first coupled sublayer is made of a CoFe alloy, 0.5 nm in thickness, the second coupled sublayer is made of a CoFeB alloy and has a thickness of 0.75 nm, and the third coupled sublayer is made of a CoFeB alloy and has a thickness between 0.45 nm and 0.95 nm;
wherein the magnetoresistive element is thermally treated at 310° C. during 90 min under an applied magnetic field of about 1T.

2. The magnetoresistive element, according to claim 1, wherein the insert layer is amorphous or quasi-amorphous or nanocrystalline.

3. A magnetic field sensor for sensing a two-dimensional magnetic field, comprising a magnetoresistive element, comprising:
a ferromagnetic reference layer having a fixed reference magnetization, a ferromagnetic sense layer having a sense magnetization that can be freely oriented relative to the reference magnetization in the presence of an external magnetic field, and a tunnel barrier layer between the reference and sense ferromagnetic layers;
the reference layer comprising a reference coupling layer between a reference pinned layer and a reference coupled layer;
the reference coupled layer comprises a first coupled sublayer in contact with the reference coupling layer, a second coupled sublayer in contact with the first coupled sublayer, a third coupled sublayer and an insert layer between the second and third coupled sublayers, the insert layer providing a ferromagnetic exchange coupling between the second and third coupled sublayers; and
the insert layer has a thickness of 0.2 nm;
the reference pinned layer comprises a CoFe alloy and has a thickness of 2 nm, the tunnel barrier layer comprises Mg;
wherein the insert layer comprises Ta, the first coupled sublayer is made of a CoFe alloy, 0.5 nm in thickness, the second coupled sublayer is made of a CoFeB alloy and has a thickness of 0.75 nm, and the third coupled sublayer is made of a CoFeB alloy and has a thickness between 0.45 nm and 0.95 nm;
wherein the magnetoresistive element is thermally treated at 310° C. during 90 min under an applied magnetic field of about 1T.

* * * * *